United States Patent [19]

Hiroshi

[11] Patent Number: 5,222,067
[45] Date of Patent: Jun. 22, 1993

[54] DETECTION OF PATTERN-SENSITIVE FAULTS IN RAM BY USE OF M-SEQUENCERS

[75] Inventor: Kashiwagi Hiroshi, Kumamoto, Japan

[73] Assignee: Terenix Co., Ltd., Tokyo, Japan

[21] Appl. No.: 490,399

[22] Filed: Mar. 8, 1990

[51] Int. Cl.$^5$ ............................................. G11C 29/00
[52] U.S. Cl. ................................. 371/21.3; 371/22.1; 371/21.2; 371/27
[58] Field of Search ..................... 371/21.3, 21.1, 21.2, 371/27

[56] References Cited

U.S. PATENT DOCUMENTS

| | | | |
|---|---|---|---|
| 4,369,511 | 1/1983 | Kimura et al. | 371/21.2 |
| 4,715,034 | 12/1987 | Jocobson | 371/21.2 |
| 4,730,318 | 3/1988 | Bogholtz, Jr. et al. | 371/27 |
| 4,757,503 | 7/1988 | Hayes et al. | 371/21.1 |
| 4,852,096 | 7/1989 | Brinkman | 371/27 |
| 4,873,705 | 10/1989 | Johnson | 371/21.2 |
| 4,885,748 | 12/1989 | Hoffmann et al. | 371/21.3 |

Primary Examiner—Robert W. Beausoliel
Assistant Examiner—Ly V. Hua
Attorney, Agent, or Firm—Burgess, Ryan & Wayne

[57] ABSTRACT

The detection method for Pattern Sensitive Faults by use of M-sequencies includes the steps of clearing the entire memory arrays, reading the memory arrays, and checking if the memory cells are cleared, filling the properly selected group with two or three kinds of M-sequencies whose phases are different from each other, reading and checking the memory of the neighboring cells for the correct content, and repeating the above steps by shifting the element of each M-sequence and by changing the position of the above groups of memory cells.

3 Claims, 5 Drawing Sheets

FIG. 1
PRIOR ART

|   | N |   |
|---|---|---|
| W | B | E |
|   | S |   |

FIG. 2

| A | B | A | B | A | B | A | B |
|---|---|---|---|---|---|---|---|
| B | A | B | A | B | A | B | A |
| A | B | A | B | A | B | A | B |
| B | A | B | A | B | A | B | A |
| A | B | A | B | A | B | A | B |
| B | A | B | A | B | A | B | A |
| A | B | A | B | A | B | A | B |
| B | A | B | A | B | A | B | A |

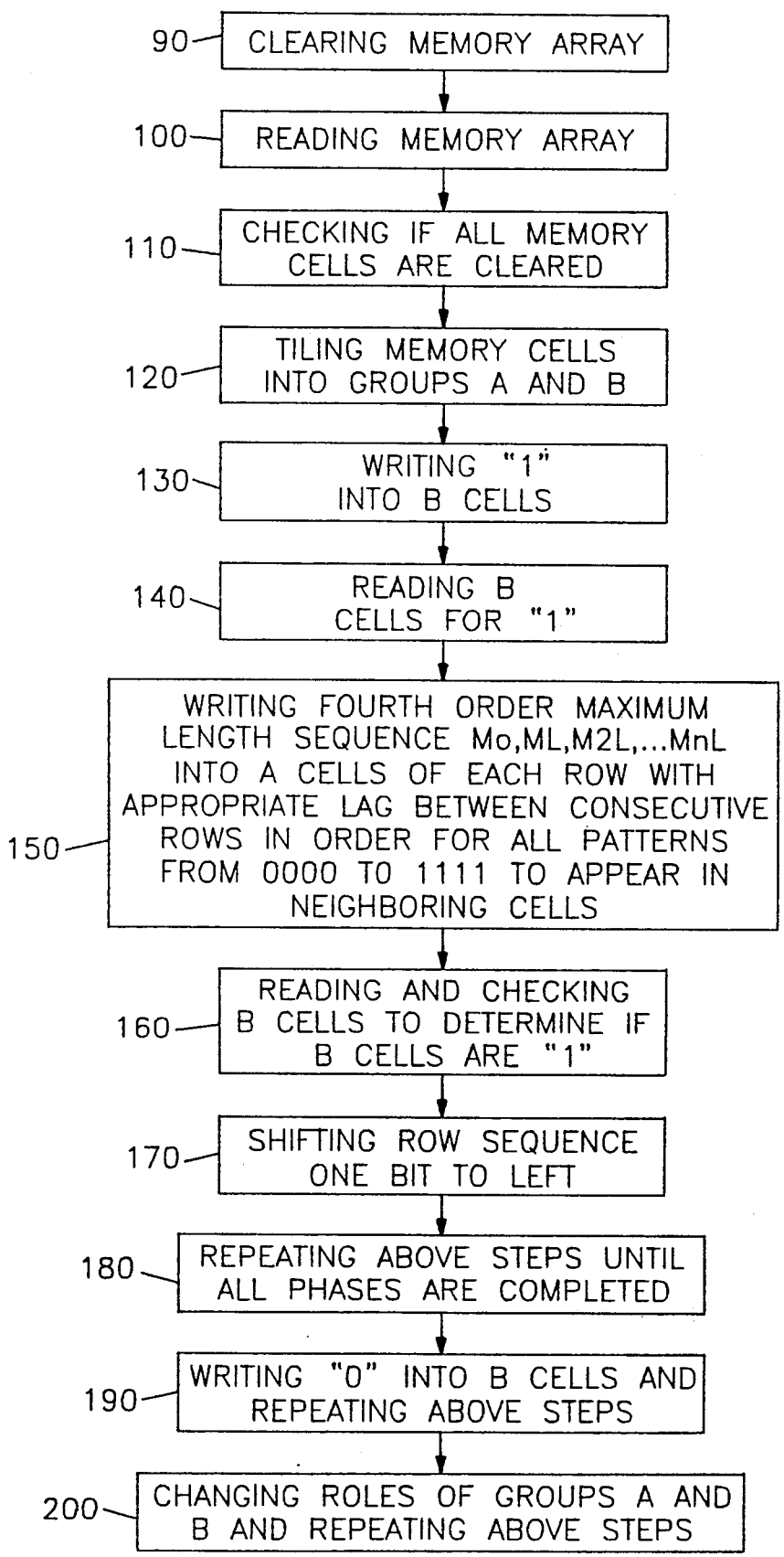

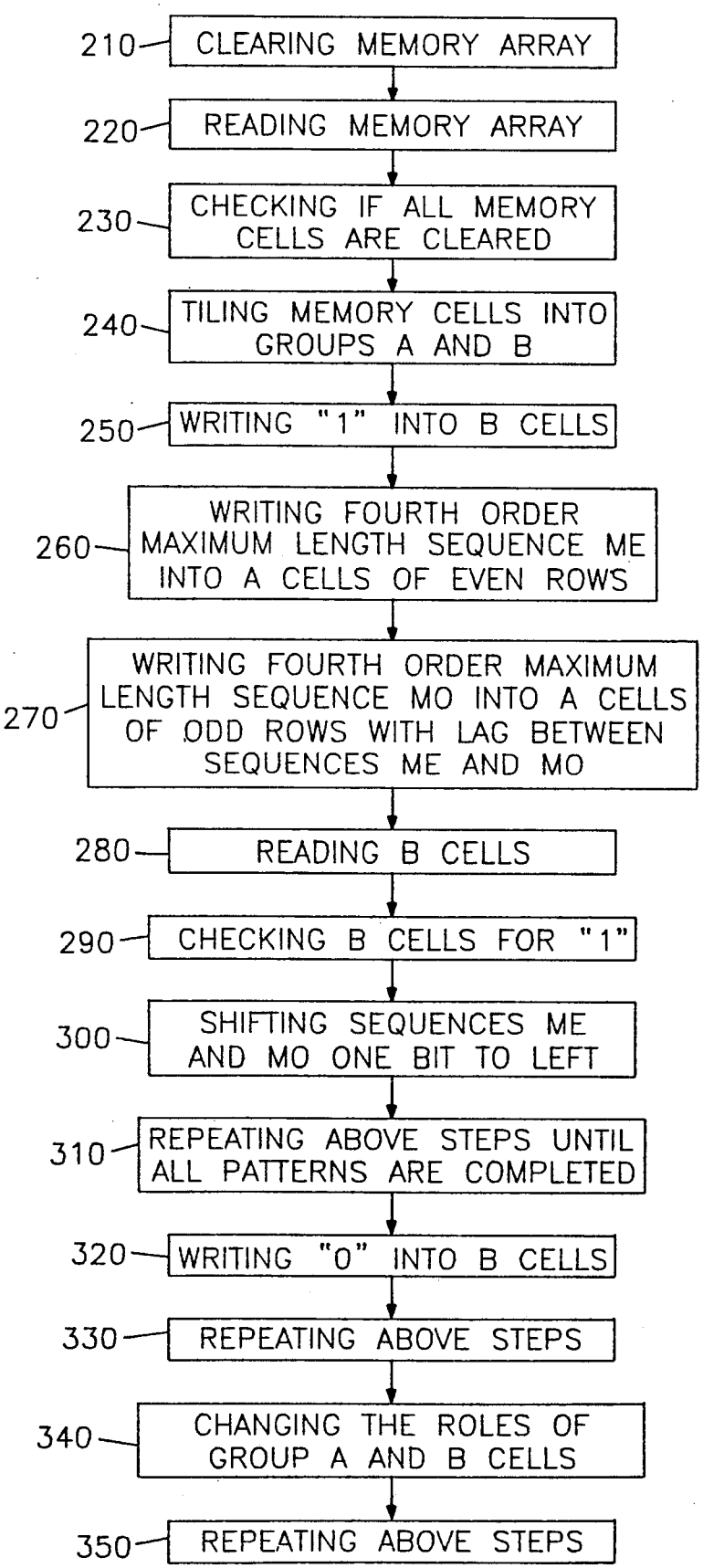

DETECTION OF PATTERN-SENSITIVE FAULTS IN RAM BY USE OF M-SEQUENCERS

FIELD OF THE INVENTION

This invention is related to the fault detection of IC memories by use of M-sequences. According to the recent development of data processing devices and information related devices, the demand for IC memories is greatly increasing. Among them, random-access-memories(RAM), in which the content is read or written arbitrarily, are becoming major memories by the use of integration technology; RAM with 4M bits per chip is now widely used and 16M bits per chip RAM is expected to appear in the near future. In this way, when the integration of RAM becomes of high density, the detection of faults of RAM becomes an important technology in the course of manufacturing and checking processes of IC memories. Among various faults of RAM, the so called pattern sensitive faults (PSF) are usually difficult to detect because the PSF are the faults in which the content of the memory cell is affected by the influence of the neighboring cells. In order to detect PSF, there is much time and labor and an easy and simple method for detection of PSF has not yet been found. This invention offers an effective method for the detection of PSF by use of M-sequences, known as one of the pseudorandom sequences.

BACKGROUND OF THE INVENTION

Before the explanation of the invention, let's explain a little bit about the M-sequence.

M-sequence, which is the abbreviation of maximum length sequence, is defined as the sequence $\{a_i\}$ which is generated by a shift register circuit with a certain feedback as shown in FIG. 3. The M-sequence can be generated from the equation $a_{i+n}$. Although there exists a multi-level M-sequence, the M-sequence, widely used is of two-levels having either 0 or 1; in FIG. 3, $h_i = 0$ or 1 and $a_i = 0$ or 1. We consider hereafter only the two-level M-sequence unless otherwise stated. M-sequence has the following properties:

(1) The period is $2^n - 1$ ($n = 1, 2, \ldots$), where n is the number of the stages of the shift register.
(2) Every possible n-tuple except all zero appears exactly once in a period. That is, when we take an n-tuple $(a_i, a_{i+1}, \ldots a_{i+n-1})(i=0,1,\ldots,2^n-2)$, every possible n-tuple except an all zero pattern appears once and only once in a period. So when the content of the n-tuple is considered to be a binary number, all integers except zero from 1 to $2^n - 1$ appear once in a period.
(3) In a period $2^n - 1$, there are $2^{n-1} - 1$ zeros and $2^{n-1}$ ones. That is, the number of ones and zeros in a period is nearly equal. This invention uses the property (1) and (2) together with the two dimensional property of M-sequence when the M-sequence is arranged in two dimensional fashion.

Now, the outline of the detection method of pattern-sensitive-faults is described. FIG. 1 shows a two-dimensional array of a memory where B denotes the cell under consideration (called base cell). The neighboring cells are denoted as N,S,W,E. The pattern-sensitive-fault is such a fault as the content of cell B, originally supposed to be 0 (or 1), changes to 1 (or 0) when the content of NSWE is, say 1110. In order to detect PSF, it is necessary to check if the content of B is changed for all 16 patterns of neighboring cells NSWE from 0000 to 1111. Various researchers have tried to find some method for PSF detection as to what kind of sequences should be used and how the sequence are used for writing each memory cell effectively. However, those previous methods are very complicated from the point of view of algorithm and are not suited for built in test. This invention covers those defects by use of pseudo-random M-sequence.

SUMMARY OF THE INVENTION

This invention proposes three methods for PSF detecting by use of M-sequences. The summary is as follows. Here $M_j$ denotes the M-sequence of fourth or fifth order starting from $a_j$; $M_j = \{a_j, a_{j+1}, \ldots \}$.

Method (a)

At first the entire memory array is cleared. It is then read and checked if it is cleared. Then, fill the first row of the memory array with $M_0$ of the fifth order M-sequence, the second row with $M_L$, and the third row with $M_{2L}$ and so on. The delay L between the rows is theoretically determined beforehand in order for all the patterns from 0000 to 1111 to appear in the neighboring cells (Here the neighboring cells are defined as four neighboring cells around a base cell; up and down, left and right). Then the content of each cell is read and checked for the correct content. The procedure up to this point is called one phase. After this is over, the input sequence to the memory array $M_O$, $M_L$, $M_{2L}$ and so on are shifted one bit to the left and repeat the procedure until all the 31 phases are over. Thus the PSF in RAM are completely checked.

Method (b)

At first, clear the entire memory array, read the memory array and then check if it is cleared. The memory cells are tiled into group A and group B in order for adjacent neighboring cells to be in A and B. At first, write 1 into B cells and read B cells for 1. Then write the fourth order M-sequence $M_O$, $M_L$, $M_{2L}$, and so on into A cells of each row with appropriate lag L between the consecutive rows in order for all patterns from 0000 to 1111 to appear in the neighboring cells. Then B cells are read and checked if they are 1. Shift the row sequence one bit to the left and repeat the procedure until all the 31 phases are over. Next, write 0 into B cells and repeat the procedure. And change the roles of A and B and repeat the procedure. Thus the PSF in RAM are completely checked.

Method (c)

At first, clear the entire memory array, read the memory array and then check if it is cleared. The memory cells are tiled into group A and group B. Write 1 into B cells of both even and odd rows. Write the fourth order M-sequence $M_E$ into A cells of even rows and $M_O$ into A cells of the odd rows. The lag between the sequence $M_E$ and $M_O$ is theoretically chosen beforehand in order for all the patterns from 0000 to 1111 appear in the four neighboring cells around a base cell. Then read B cells and check them for 1. Shift the $M_E$ and $M_O$ one bit to the left and repeat the procedure until all the fifteen patterns are over. Write 0 into B cells and repeat the procedure. And change the roles of A and B cells and repeat the procedure. Thus the PSF in RAM are completely checked.

BRIEF EXPLANATION OF THE ACCOMPANYING DRAWINGS

FIG. 1 shows the state of a memory which is the object of a test by a first method of the present invention and is composed of a base cell B and four neighboring cells NSWE.

FIG. 2 shows the state of a memory which is the object of a test by second and third methods of the present invention, in which each A cell is in the neighborhood of each B cell and vice-versa.

FIG. 5 is a flow chart diagram of another embodiment of the method of the present invention.

FIG. 6 is a flow chart diagram of another embodiment of the method of the present invention.

DETAILED DESCRIPTION OF THE INVENTION

The three methods described in the summary of the invention are explained individually.

The method (a) is the PSF detection method using 5th order M-sequence. As denoted in FIG. 1, all the patterns appearing in NWBES are $2^5$ patterns from 00000 to 11111. Therefore the sequence to be input to memories must have the period of at least $2^5$. But when the memory cells are cleared at first and then checked for 0 before we start the procedure, the sequence having the period of $2^5-1$ is sufficient. The M-sequence of fifth order is the right sequence suitable for this purpose. The lag between row sequences must be determined beforehand in order for all the patterns to appear in the neighboring cells NWSE. How to select this lag is one of the most important points of this invention. Let the fifth order M-sequence be $M_0$.

$$M_0 = (m_0, m_1, \ldots m_{30}, m_0, \ldots)(m_i = 0 \text{ or } 1) \quad (1)$$

When this sequence $M_0$ is written into the first row of the memory array, the sequence written in the second row is the L bit delayed version $M_L$ as follows:

$$M_L = (m_L, m_{L+1}, m_{L+2}, \ldots) \quad (2)$$

Then the sequence written in the third row is $$M_L^2 = (m_{2L}, m_{2L+1}, m_{2L+2}, \ldots) \quad (3)$$

Figure 3:
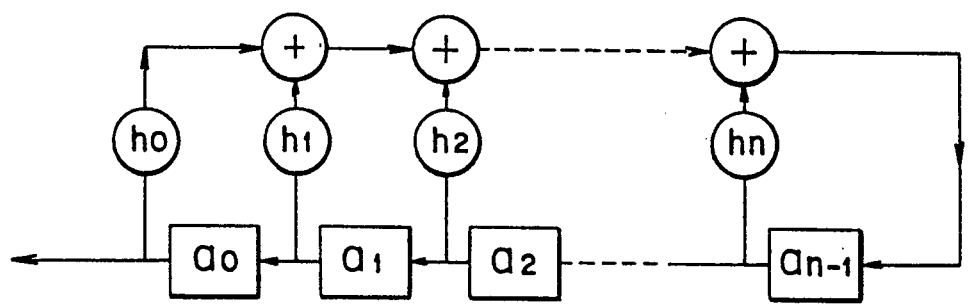
FIG. 3 shows a block diagram for generation of the M-sequence.
Figure 4:
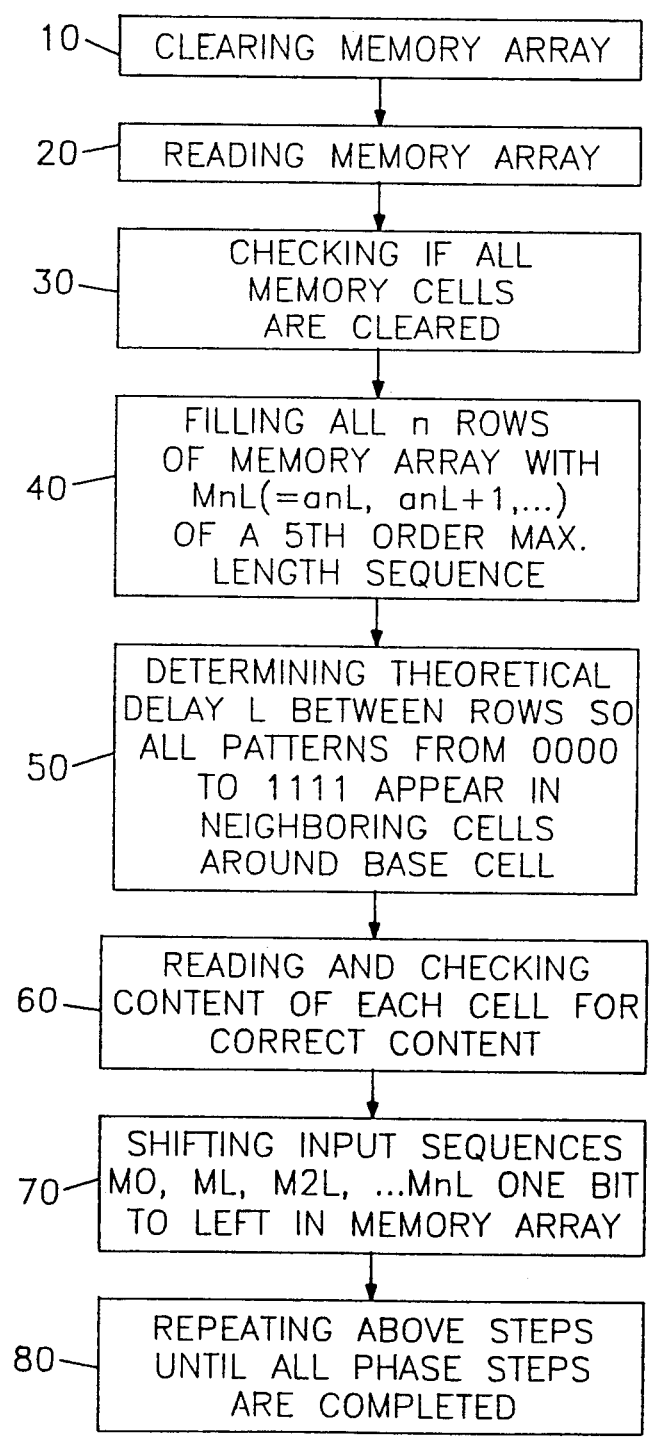
FIG. 4 is a flow chart diagram of one embodiment of the method of the present invention.

Then the test procedure is as follows with reference to FIG. 4:

(1) Clear the entire memory arrays in step 4A.
(2) Read the memory cells in step 4B and check if they are cleared in step 4C.
(3) Fill the first row with sequence $M_O$, the second row with $M_L$, the third row with $M_{2L}$ and so on in step 4D.
(4) Read and check if the written message exists in step 4F.
(5) (3) and (4) together represent one phase. Now shift $M_O$, $M_L$, $M_{2L}$ . . . one bit to the left in step 4G and repeat steps (3) and (4) till all the 31 phases are over in step 4H.

Determining the theoretical delay L between rose so that all patterns from 0000 to 1111 appear in neighboring cells around the base cell, as shown in step 4E, will now be described. Now suppose the base cell under test is the (i+1)th position of the memory array. Then the four neighboring cells in NWBES are written as follows.

$$\begin{array}{c} m_i \\ m_{i+L-1} \; m_{i+L} m_{i+L+1} \\ m_{i+2L} \end{array}$$

When we use such a delay operator X as $X_i$ which represent $m_i$, then the generalized pattern of NWBES would be of the form:

$$\begin{array}{c} X_i \\ X_{i+L-1} \; X_{i+L} X_{i+L+1} \\ X_{i+2L} \end{array} \quad (4)$$

Note that the powers of X are taken modulo period length of the sequence. In order for all the pattern to appear in array (4), every term in (4) must be linearly independent. As we supposed earlier, the memory array is first cleared and checked for zero. So all the patterns of $2^5-1$ must appear in (4). If there exist any linear dependence between any terms in (4), we cannot have all the patterns. This is obvious if we consider the following example. Suppose there exist the linear relation.

$$X^i + X^{i+l} = X^{i+2l} (\text{base} 2)$$

Then if $X^i = 1$ and $X^{i+l} = 1$, $X^{i+2l}$ must be zero. So the pattern $X^i = X^{i+l} = X^{i+2} = 1$ cannot appear at all. In order for every term in (4) is linearly independent, the following conditions must be satisfied.

Condition 1: For a chosen lag, two or more terms should not have the same power; otherwise, in any phase, the same elements appear in those cells and consequently all the required patterns are not generated.

Condition 2: No term can be expressed as a linear combination of two or more of the remaining terms. If any term is expressed as a linear combination of other terms, they are linearly dependent. In order to check this condition, we form set S of polynomials taking three or more terms in array (4) at a time.

$$\begin{aligned} S = \{ & (X^{2L} + X^{L+1} + X^L + X^{L-1} + X^0), \\ & (X^{2L} + X^{L+1} + X^L + X^{L-1}), (X^{2L} + X^{L+1} + X^L + X^{L-1} + X^0), \\ & (X^{L+1} + X^L + X^{L-1} + X^0), (X^{2L} + X^{L+1} + X^L + X^0), \\ & (X^{2L} + L^{L+1} + X^L), (X^{2L} + X^L + X^{L-1} + X^0), \\ & (X^{2L} + X^{L+1} + X^0), (X^{2L} + X^{L-1} + X^0), \\ & (X^{2L} + X^L + X^{L-1}), (X^{2L} + X^L + X^0), (X^{2L} + X^{L+1} + X^{L-1}), \\ & (X^{L+1} + X^L + X^{L-1}), (X^{L+1} + X^L + X^0), \\ & (X^{L+1} + X^{L-1} + X^0), (X^L + X^{L-1} + X^0) \} \end{aligned} \quad (5)$$

where each element of set S is taken for i=0, since the linear independence among terms of array (4) has no relation to i. Now let p(x) be the characteristic polynomial of the M-sequence. Then let us check equation(6) for linear independence. If any term of S modulo P(X) is equal to zero, where P(X) is the characteristic polynomial of the M-sequence, then the terms are linear dependent. Hence for linearly independence, we check $$F(X) \text{ modulo} P(X) = 0, \text{ where } F(X) \in S \quad (6)$$

TABLE 1

| Characteristic polynomial P(x) = $x^5 + x^2 + 1$ | | | | | | | | | | | | | | | |
|---|---|---|---|---|---|---|---|---|---|---|---|---|---|---|---|
| lag L | 0 | 1 | 2 | 3 | 4 | 5 | 6 | 7 | 8 | 9 | 10 | 11 | 12 | 13 | 14 |
| *A |   | s | s |   |   |   |   | s |   |   | s |   | s | s |   |
| *B | t | t |   |   | q | q | q |   | q |   | q |   |   | q | q |
| lag L | 15 | 16 | 17 | 18 | 19 | 20 | 21 | 22 | 23 | 24 | 25 | 26 |   |   |   |
| *A | s | s |   |   | s | s |   | s |   | s |   |   |   |   |   |
| *B |   |   | q | q |   |   | q |   | q |   | q | q |   |   |   |
| lag L | 27 | 28 | 29 | 30 |   |   |   |   |   |   |   |   |   |   |   |
| *A |   | s | s |   |   |   |   |   |   |   |   |   |   |   |   |
| *B | q |   |   | t |   |   |   |   |   |   |   |   |   |   |   |

In Table 1, the results of search for lags which satisfy the condition 1 and 2 are shown, where *A denotes the case where all the pattern exist, and *B denotes the case of linear dependence. s denotes the case where all the pattern exist, t denotes the case where same elements appear in (4), and q denotes the case where condition 2 is not satisfied. From Table 1, we see the usable lags for the existence of linear independence between NWBES are 2,3,7,9,11,12,15,16,19,20,22,24,28, and 29.

The method (b) uses M-sequence of fourth order. In method (a), the test sequence is written into NWBES cells of a memory array in each phase. Hence during read and check operation of each phase, it is necessary to regenerate the test sequence for a compare operation. This is rather tedious work. The method (b) is a method to avoid this. In method (b), we fix the contents of the base cell B to 1 or 0 and use the fourth order M-sequence to create all patterns in the neighboring NEWS. The memory array here is tiled into group A and group B as shown in FIG. 2. The test procedure is as follows:

(1) Clear the entire memory array in step 5a.
(2) Read and check if the memory cells are cleared in steps 5B and 5C.
(2a) tiling memory cells into groups A and B in step 5D.
(3) Write a 1 into base cells (B cells) in step 5E.

and then 1's. For any base cells, the possible generalized pattern are:

$$\begin{matrix} & X^i & \\ X^{i+L-1} & . & X^{i+L} \\ & X^{i+2L} & \end{matrix} \quad (7)$$

$$\begin{matrix} & X^i & \\ X^{i+L} & . & X^{i+L+1} \\ & X^{i+2L} & \end{matrix} \quad (8)$$

As in array (5), we form a set S as follows:
For array (7), $$S=\{(X_{2L}+X^L+X^{(L-1)}+X^0),(X^{2L}+X^L+X^{(L-1)}),\\ (X^{2L}+X^{(L-1)}+X^0),(X^{2L}+X^L+X^0),(X^L+X^{(L-1)}+X^0)\} \quad (9)$$

For array (8), $$S=\{(X^{2L}+X^{(L+1)}+X^L+X^0),(X^{2L}+X^{(L+1)}+X^L),\\ (X^{2L}+X^{(L+1)}+X^0),(X^{2L}+X^L+X^0),(X^{(L-1)}+X^L+X^0)\} \quad (10)$$

As in method (a), the conditions 1 and 2 are checked for linear independence, and we get the results as shown in Table 2.

TABLE 2

| For array (7) | | | | | | | | | | | | | | | |
|---|---|---|---|---|---|---|---|---|---|---|---|---|---|---|---|
| lag L | 0 | 1 | 2 | 3 | 4 | 5 | 6 | 7 | 8 | 9 | 10 | 11 | 12 | 13 | 14 |
| *A |   |   |   |   | s |   | s | s | s | s |   | s |   |   |   |
| *B | t | t | q | q |   | q |   |   |   |   | q |   | q | q | t |
| For array (S) | | | | | | | | | | | | | | | |
| lag L | 0 | 1 | 2 | 3 | 4 | 5 | 6 | 7 | 8 | 9 | 10 | 11 | 12 | 13 | 14 |
| *A |   |   | s | s |   |   | s | s | s | s |   |   | s | s |   |
| *B | t | t |   |   | q | q |   |   |   |   | q | q |   |   | t |
| When array (7) and (8) are combined, | | | | | | | | | | | | | | | |
| lag L | 0 | 1 | 2 | 3 | 4 | 5 | 6 | 7 | 8 | 9 | 10 | 11 | 12 | 13 | 14 |
| *A |   |   |   |   |   |   | s | s | s | s |   |   |   |   |   |
| *B | t | t | q | q | q | q |   |   |   |   | q | q | q | q | t |

(4) Read B cells and check them for a 1 in step F.
(5) Write the chosen test sequence $M_O$ into A cells in the first row, $M_L$ in the second row, $M_{2L}$ in the third row and so on in step 5G. The lag L between rows is theoretically determined beforehand.
(6) Read B cells and check them for a 1 in step 5H.
(7) Shift the row sequences one bit to the left in step 5I and repeat the steps (5) and (6) in step 5J till all the test patterns are covered.
(8) Write 0 into B cells and repeat step (4)–(7) in step 5K, but this time read B cells for a 0 in all read operations.
(9) Change the roles of A and B cells and repeat the step (3)–(8) in step 5L.

In steps in (3)–(8), 1's are written into B cells first, and then 0's are used. But, of course, we can also use 0's first Here we see that the usable lags in this case are 6,7,8,9. In methods (a) and (b), it was necessary to apply appropriate lag L between consecutive rows to obtain a complete test pattern. In practice, the row length is of the form 8,16, 32, . . .

Therefore, when we use the fourth order M-sequence (N=15) and write it continuously into consecutive rows, we have automatic lag 1,2,4,8 depending on the row length 16,32,64,128. So if we take advantage of this fact, we don't have to apply artificial lag between each row, which leads to method (c). In method (c), the memory cells are tiled as shown in FIG. 2 as in the method (b). Let E-array be the array of even rows and O-array be the arrays of odd rows. Then, the fourth order test sequence $M_E$ for the E-array and $M_O$ for the O-array are formed.

$M_E = m_0, m_1, \ldots, m_{14}, m_0, m_1, \ldots$ $M_O = m_k, m_{k+1}, \ldots$ where k is the lag between $M_E$ and $M_O$. The test procedure is as follows.

(1) Clear the entire memory array in step 6A.
(2) Read and check if the memory cells are cleared in steps 6B and 6C.
(2a) tiling memory groups into groups A and B in step 6D.
(3) Write a 1 into base cells (B cells) of both E-array and O-array in step 6E.
(4) Read B cells of both arrays for a 1.
(5) Write $M_E$ sequentially into A cells of E-array in step 6F and $M_O$ sequentially into A cells of O-array in step 6G.
(6) Read B cells of both arrays in step 6H and check for a 1 in step 6I.
(7) Advance the sequence $M_E$ and $M_O$ by one bit in step 6J and repeat steps (5) and (6) till all the fifteen patterns are over in step 6K.
(8) Write a 0 into B cells in step 6L and repeat steps (4)–(6) and (7) in step 6M, but this time read B cells for a 0.

(9) Change the roles of A and B cells in step 6N and repeat steps (3)–(8) in step 6O.

Now the problem is how to select the lag k in order for all the patterns to appear in the neighboring cells.

When the base cell is taken in A cells, the sequence of B cells are represented in the generalized pattern as;

$$\begin{array}{cc} & X^i \\ X^{i+k-1} & . \quad X^{i+k} \\ & X^{i+L} \end{array} \quad (11)$$

When the base cell is taken in B cells, the sequence of A cells are represented in generalized pattern as;

$$\begin{array}{cc} & X^i \\ X^{i+l-k} & . \quad X^{i+L-k+1} \\ & X^{i+L} \end{array} \quad (12)$$

$$\begin{array}{cc} & X^i \\ X^{i+k} & . \quad X^{i+k+1} \\ & X^{i+L} \end{array} \quad (13)$$

$$\begin{array}{cc} & X^i \\ X^{i+L-k-1} & . \quad X^{i+L-k} \\ & X^{i+L} \end{array} \quad (14)$$

Now, we form set S as in method(a) and (b). For array (11)

$$S = \{(X^L + X^k + X^{k-1} + X^0), (X^L + X^k + X^{(k-1)}), (X^L + X^k + X^0), (X^L + X^{k-1} + X^0), (X^k + X^{k-1} + X^0)\} \quad (15)$$

For array (12)

$$S = \{(X^L + X^{L-k} + X^{L-k-1} + X^0), (X^L + X^{L-k} + X^{L-k-1}), (X^{L-k} + X^{L-k-1} + X^0), (X^L + X^{L-k} + X^0), (X^L + X^{L-k-1} + X^0)\} \quad (16)$$

As in methods (a) and (b), conditions 1 and 2 are checked for linear independence. The results are shown in Table 3-1.

TABLE 3-1

| Characteristic equation $P(x) = x^4 + x + 1$ | | | | | | | | | | | | | | | |
|---|---|---|---|---|---|---|---|---|---|---|---|---|---|---|---|
| For array (11) | | | | | | | | | | | | | | | |
| k | 0 | 1 | 2 | 3 | 4 | 5 | 6 | 7 | 8 | 9 | 10 | 11 | 12 | 13 | 14 |
| L | | | | | | | | | | | | | | | |
| 1 | t | t | t | s | q | q | s | s | s | s | s | s | q | q | s |
| 2 | t | t | t | t | s | q | s | s | q | q | s | s | q | s | q |
| 4 | t | t | q | s | t | t | s | s | s | s | s | s | q | q | s |
| 8 | t | t | q | q | s | q | s | s | t | t | s | s | q | s | q |
| For array (12) | | | | | | | | | | | | | | | |
| k | 0 | 1 | 2 | 3 | 4 | 5 | 6 | 7 | 8 | 9 | 10 | 11 | 12 | 13 | 14 |
| L | | | | | | | | | | | | | | | |
| 1 | t | t | t | s | q | q | s | s | s | s | s | s | q | q | s |
| 2 | t | t | t | t | q | s | q | s | s | q | q | s | s | q | s |
| 4 | t | t | s | q | t | t | s | q | q | s | s | s | s | s | s |
| 8 | t | t | s | s | q | s | q | q | t | t | q | s | q | s | s |
| When array (11) and (12) are combined. | | | | | | | | | | | | | | | |
| k | 0 | 1 | 2 | 3 | 4 | 5 | 6 | 7 | 8 | 9 | 10 | 11 | 12 | 13 | 14 |
| L | | | | | | | | | | | | | | | |
| 1 | t | t | t | s | q | q | s | s | s | s | s | s | q | q | s |
| 2 | t | t | t | t | q | q | q | s | q | q | q | s | q | q | q |
| 4 | t | t | q | q | t | t | s | q | q | s | s | s | q | q | s |
| 8 | t | t | q | q | q | q | q | q | t | t | q | s | q | s | q |

As is seen from Table 3-1, the lag k between even rows and odd rows should be taken to be 11, since when k=11 the neighboring cells are linearly independent for all L, the automatic lag between even rows and odd rows. In the same way, we form set S for arrays (13) and (14). For arrays (13), $$S = \{(X^L + X^{k+1} + X^k + X^0), (X^L + X^{k+1} + X^k), (X^L + X^{k+1} + X^0), (X^L + X^k + X^0), (X^{k+1} + X^k + X^0)\} \quad (17)$$

For array (14), $$S = \{(X^L + X^{L-k-1} + X^{L-k} + X^0), (X^L + X^{L-k-1} + X^{L-k}), (X^L + X^{L-k-1} + X^0), (X^L + X^{L-k} + X^0), (X^{L-k-1} + X^{L-k} + X^0)\} \quad (18)$$

The results of checking conditions 1 and 2 for arrays (17) and (18) are shown in Table 3-2.

TABLE 3-2

| Characteristic equation $P(x) = x^4 + x + 1$ |
|---|

For array (17),

| k | 0 | 1 | 2 | 3 | 4 | 5 | 6 | 7 | 8 | 9 | 10 | 11 | 12 | 13 | 14 |
|---|---|---|---|---|---|---|---|---|---|---|----|----|----|----|----|
| L |   |   |   |   |   |   |   |   |   |   |    |    |    |    |    |
| 1 | t | t | s | q | q | s | s | s | s | s | s  | q  | q  | s  | t  |
| 2 | t | t | t | s | q | s | s | q | q | s | s  | q  | s  | q  | t  |
| 4 | t | q | s | t | t | s | s | s | s | s | s  | q  | q  | s  | t  |
| 8 | t | q | q | s | q | s | s | t | t | s | s  | q  | s  | q  | t  |

For array (18),

| k | 0 | 1 | 2 | 3 | 4 | 5 | 6 | 7 | 8 | 9 | 10 | 11 | 12 | 13 | 14 |
|---|---|---|---|---|---|---|---|---|---|---|----|----|----|----|----|
| L |   |   |   |   |   |   |   |   |   |   |    |    |    |    |    |
| 1 | t | t | d | q | q | s | s | s | s | s | s  | q  | q  | s  | t  |
| 2 | t | t | t | q | s | q | s | s | q | s | q  | s  | s  | q  | t  |
| 4 | t | s | q | t | t | s | q | q | s | s | s  | s  | s  | s  | t  |
| 8 | t | s | s | q | s | q | q | t | t | q | s  | q  | s  | s  | t  |

When arrays (17) and (18) are combined,

| k | 0 | 1 | 2 | 3 | 4 | 5 | 6 | 7 | 8 | 9 | 10 | 11 | 12 | 13 | 14 |
|---|---|---|---|---|---|---|---|---|---|---|----|----|----|----|----|
| L |   |   |   |   |   |   |   |   |   |   |    |    |    |    |    |
| 1 | t | t | s | q | q | s | s | s | s | s | s  | q  | q  | s  | t  |
| 2 | t | t | t | q | q | q | s | q | q | q | s  | q  | s  | q  | t  |
| 4 | t | q | q | t | t | s | q | q | s | s | s  | q  | q  | s  | t  |
| 8 | t | q | q | q | q | q | q | t | t | q | s  | q  | s  | q  | t  |

In this case, k should be taken to be 10 since the neighboring cells are linearly independent for all L. The M-sequence has the property that it is very easy to generate and, in addition, it has uniformly distributed patterns. Taking advantage of this property and using a suitably chosen value of lag between memory rows, it is possible to generate all the patterns in the neighboring cells around any cell. And this can be done during the same number of phases as the period of M-sequence. In other words, it is possible to generate the ideal patterns in the neighboring cells around any base cell, in the sense that the patterns appearing in the neighboring cells around any cell in one phase are all different and the patterns appearing in the neighboring cells around a specified cell is all different in every phase; there are no redundancy. Therefore, this method provides a very simple, efficient and epoch-making method for pattern sensitive fault detection of RAM.

What is claimed is:

1. A detection method for pattern sensitive faults by use of maximum length sequences comprising the steps of:

clearing a memory array;
   reading the memory array;
   checking if all memory cells of the memory array are cleared;
   filling a first row of the memory array with $M_o (= a_o, a_1, \ldots)$ of a fifth order maximum length sequence, a second array row with a maximum length sequence $M_L (= a_L, a_{L+1}, \ldots)$, a third array row with maximum length sequence $(= a_{2L}, a_{2L+1}, \ldots)$, all remaining array rows n with maximum length sequences $M_{nL} (= a_{nL}, a_{nL+1}, \ldots)$, where L and n are integers,
   determining a theoretical delay L between the rows in order for all patterns from 0000 to 1111 to appear in neighboring cells, the neighboring cells being defined as four neighboring cells around a base cell;
   reading and checking the content of each cell for the correct content such that the above steps constitute one phase;
   shifting the input sequences $M_o, M_L, M_{2L}, \ldots M_{nL}$ one bit to the left in the memory array and repeating the above steps until all phase steps are completed.

2. A detection method for pattern sensitive faults by use of maximum length sequences, comprising the steps of:

clearing a memory array;
   reading the memory array;
   checking if all memory cells of the memory array are cleared;
   tiling the memory cells into a group A and a group B in order for adjacent neighboring cells to be in groups A and B,
   writing "1" into the B cells;
   reading the B cells for "1",
   writing a fourth order maximum length sequence $M_o$, $M_L, M_{2L}, \ldots MnL$ where L and N are integers into the A cells of each row with appropriate lag between consecutive rows in order for all patterns from 0000 to 1111 to appear in neighboring cells;
   reading and checking the B cells to determine if the B cells are "1" such that the above steps constitute one phase;
   shifting the row sequence one bit to the left and repeating the above steps until all phases are completed;
   writing "0" into the B cells and repeating the above steps and
   changing the roles of groups A and B and repeating the above steps.

3. A detection method for pattern sensitive faults by use of maximum length sequences, comprising the steps of:

clearing a memory array;
   reading the memory array;
   checking if all memory cells of the memory array are cleared;
   tiling memory cells into a group A and a group B;
   writing "1" into the B cells of even and odd rows;
   writing a fourth order maximum length sequence $M_E$ into the A cells of even rows and a fourth order maximum length sequence $M_o$ into the A cells of the odd rows, wherein a lag between the sequence $M_E$ and $M_o$ is theoretically chosen beforehand in order for all patterns from 0000 to 1111 to appear in four neighboring cells around a base cell;
   reading the B cells and checking the B cells for "1" such that the above steps relate to one pattern;
   shifting the sequences $M_E$ and $M_o$ one bit to the left and repeating the above steps until all patterns are completed;
   writing "0" into the B cells and repeating the above steps; and changing the roles of the group A and B cells and repeating the above steps.

* * * * *